(12) United States Patent
Miyahara

(10) Patent No.: US 10,374,619 B2
(45) Date of Patent: Aug. 6, 2019

(54) OSCILLATOR CIRCUIT

(71) Applicant: NIHON DEMPA KOGYO CO., LTD., Tokyo (JP)

(72) Inventor: Ken Miyahara, Saitama (JP)

(73) Assignee: NIHON DEMPA KOGYO CO., LTD., Tokyo (JP)

(*) Notice: Subject to any disclaimer, the term of this patent is extended or adjusted under 35 U.S.C. 154(b) by 91 days.

(21) Appl. No.: 15/473,613

(22) Filed: Mar. 30, 2017

(65) Prior Publication Data
US 2017/0288685 A1      Oct. 5, 2017

(30) Foreign Application Priority Data

Apr. 1, 2016   (JP) ................................. 2016-074502

(51) Int. Cl.
| | |
|---|---|
| *H03L 7/18* | (2006.01) |
| *H03L 7/08* | (2006.01) |
| *H03L 7/095* | (2006.01) |
| *H03L 7/099* | (2006.01) |

(52) U.S. Cl.
CPC .................. *H03L 7/18* (2013.01); *H03L 7/08* (2013.01); *H03L 7/095* (2013.01); *H03L 7/099* (2013.01)

(58) Field of Classification Search
CPC . H03L 7/08; H03L 7/143; H03L 7/197; H03L 7/107; H03L 7/18; H03L 7/099; H03L 7/095

USPC .............................. 331/1 A, 18, 10; 327/157
See application file for complete search history.

(56) References Cited

U.S. PATENT DOCUMENTS

| | | | |
|---|---|---|---|
| 6,259,328 B1* | 7/2001 | Wesolowski | H03L 7/143 327/147 |
| 2012/0249198 A1* | 10/2012 | Sinha | H03L 7/089 327/157 |

FOREIGN PATENT DOCUMENTS

| | | |
|---|---|---|
| CN | 102017421 | 11/2013 |
| TW | 200629712 | 8/2006 |
| WO | 2009034917 | 3/2009 |

OTHER PUBLICATIONS

Office Action of Taiwan Counterpart Application, with English translation thereof, dated Jan. 25, 2019, pp. 1-8.

* cited by examiner

*Primary Examiner* — Arnold M Kinkead
(74) *Attorney, Agent, or Firm* — JCIPRNET

(57) ABSTRACT

An oscillator circuit includes an oscillating unit, a counter unit, and a set value generator. The oscillating unit is configured to output an oscillation signal having a frequency corresponding to an input frequency setting value. The counter unit is configured to count a number of pulses of the oscillation signal during a time period corresponding to a period of a reference signal input from outside. The set value generator is configured to generate the frequency setting value every predetermined time period based on the count of the pulses counted by the counter unit.

6 Claims, 5 Drawing Sheets

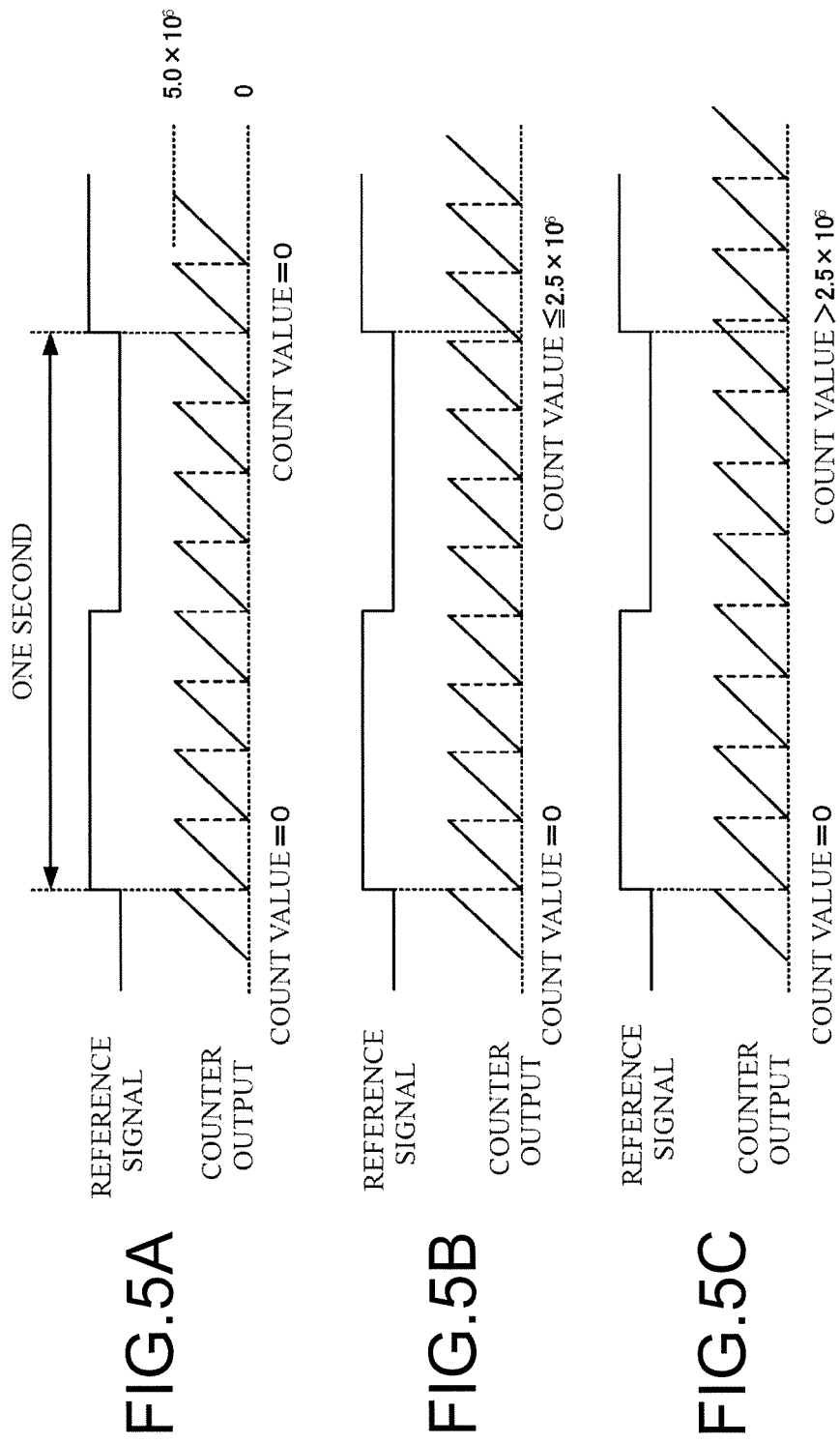

OSCILLATOR CIRCUIT

CROSS-REFERENCE TO RELATED APPLICATIONS

This application is based on and claims priority under 35 U.S.C. § 119 to Japanese Patent Application No. 2016-074502, filed on Apr. 1, 2016, the entire content of which is incorporated herein by reference.

TECHNICAL FIELD

This disclosure relates to an oscillator circuit that outputs an oscillation signal.

DESCRIPTION OF THE RELATED ART

Conventionally, there has been known an oscillator circuit that outputs an oscillation signal synchronized with an input oscillation signal. International Publication No. 2009/034917 discloses an oscillator circuit that specifies a phase difference between a signal obtained by dividing an input signal and a signal obtained by dividing an oscillation signal so as to output an oscillation signal having a frequency corresponding to a control value that indicates the specified phase difference.

PRIOR ART DOCUMENT

Patent Document

[Patent Document 1] International Publication No. 2009/034917.

In the conventional oscillator circuit, a loop filter that outputs the control value corresponding to the phase difference always operates. When the loop filter always operates in the oscillator circuit operating under a high temperature environment, it causes a problem that components (for example, a CPU) included in the loop filter deteriorate in a short time.

In view of above points, there is a need to provide an oscillator circuit capable of suppressing degradation of the constituent components.

SUMMARY

According to an aspect of this disclosure, there is provided an oscillator circuit includes an oscillating unit, a counter unit, and a set value generator. The oscillating unit is configured to output an oscillation signal having a frequency corresponding to an input frequency setting value. The counter unit is configured to count a number of pulses of the oscillation signal during a time period corresponding to a period of a reference signal input from outside. The set value generator is configured to generate the frequency setting value every predetermined time period based on the count of the pulses counted by the counter unit.

The oscillator circuit may further include an integration unit configured to calculate an integrated value of a difference between a reference pulse number corresponding to the frequency of the oscillation signal and a pulse number of the oscillation signal every period of the reference signal and outputs the integrated value every time period of predetermined times of the period of the reference signal. The set value generator may control the frequency setting value based on the integrated value.

The set value generator may be activated every integration period of an integral multiple of the period of the reference signal to vary the frequency setting value based on the integrated value.

The integration unit may, for example, initialize the integrated value every time that the integration period terminates. The integration unit adds a first integrated value at the termination of the integration period to a second integrated value at a next integration period so as to calculate the integrated value.

The integration unit may output the integrated value every integration period determined based on a time period permitted for synchronizing the oscillation signal with the reference signal.

The set value generator may generate the frequency setting value based on a smoothed integrated value generated by smoothing a plurality of the integrated values.

This disclosure provides an effect that reduces the deterioration of the components of the oscillator circuit.

BRIEF DESCRIPTION OF THE DRAWINGS

The foregoing and additional features and characteristics of this disclosure will become more apparent from the following detailed description considered with reference to the accompanying drawings, wherein:

FIG. 5A to FIG. 5C are explanatory diagrams of a modification of the operation of the phase error counter.

DETAILED DESCRIPTION

Figure 1:
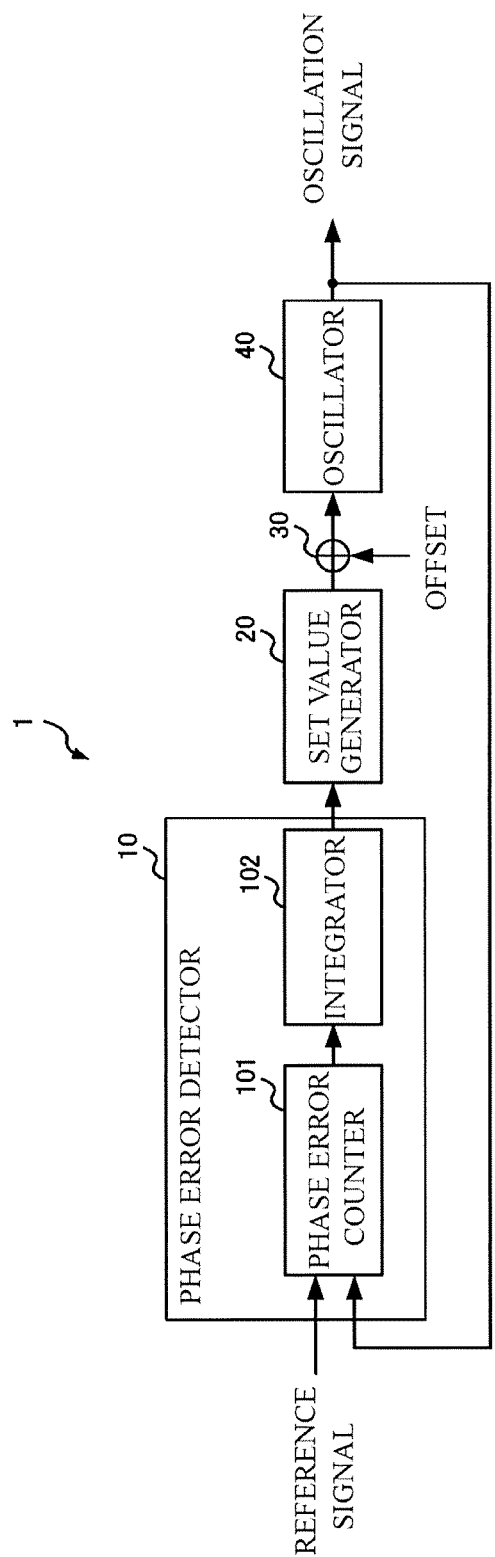
FIG. 1 is a diagram illustrating a configuration of an oscillator circuit according to an embodiment.

FIG. 1 is a diagram illustrating a configuration of an oscillator circuit 1 according to this embodiment. The oscillator circuit 1 outputs an oscillation signal that is synchronized with a reference signal input from outside and has a higher frequency compared with the reference signal. The reference signal is, for example, a 1 Pulse Per Second (PPS) signal that outputs one pulse in one second.

The oscillator circuit 1 includes a phase error detector 10, a set value generator 20, an adder 30, and an oscillator 40.

The phase error detector 10 is configured to detect a phase error between the reference signal and the oscillation signal, and includes a phase error counter 101 and an integrator 102. The phase error detector 10 is constituted of a logic circuit such as a Field Programmable Gate Array (FPGA) and an Application Specific Integrated Circuit (ASIC).

The phase error is a difference between a phase difference between the reference signal and the oscillation signal, and a target value of the phase difference. In this embodiment, the target value of the phase difference between the reference signal and the oscillation signal is 0, thus the phase error corresponds to the phase difference between the reference signal and the oscillation signal. The phase error detector 10 calculates a frequency control value corresponding to the phase error between the reference signal and the oscillation signal so as to output the calculated frequency control value to the set value generator 20.

The reference signal and the oscillation signal are input to the phase error counter 101. The phase error counter 101 is a counter unit including a counter to count a number of pulses of the oscillation signal during a time period corresponding to a period of the reference signal. The phase error counter 101 is a counter whose count value increases and decreases every time a pulse of the oscillation signal is input, thus outputting the count value at the time point to the integrator 102 at every timing of rising of the reference signal.

The period of the count operation of the phase error counter 101 is configured to be an integer fraction of the period of the reference signal when the phase error between the reference signal and the oscillation signal is 0. For example, the phase error counter 101 is configured such that when the period of the reference signal is one second, the count value returns to the original value in the period of 0.125 seconds (equivalent to a frequency of 8 Hz). When the frequency of the oscillation signal is 40 MHz, the count value varies in a range of $40 \times 10^6 8 \div 5 \times 10^6$.

Figure 2:
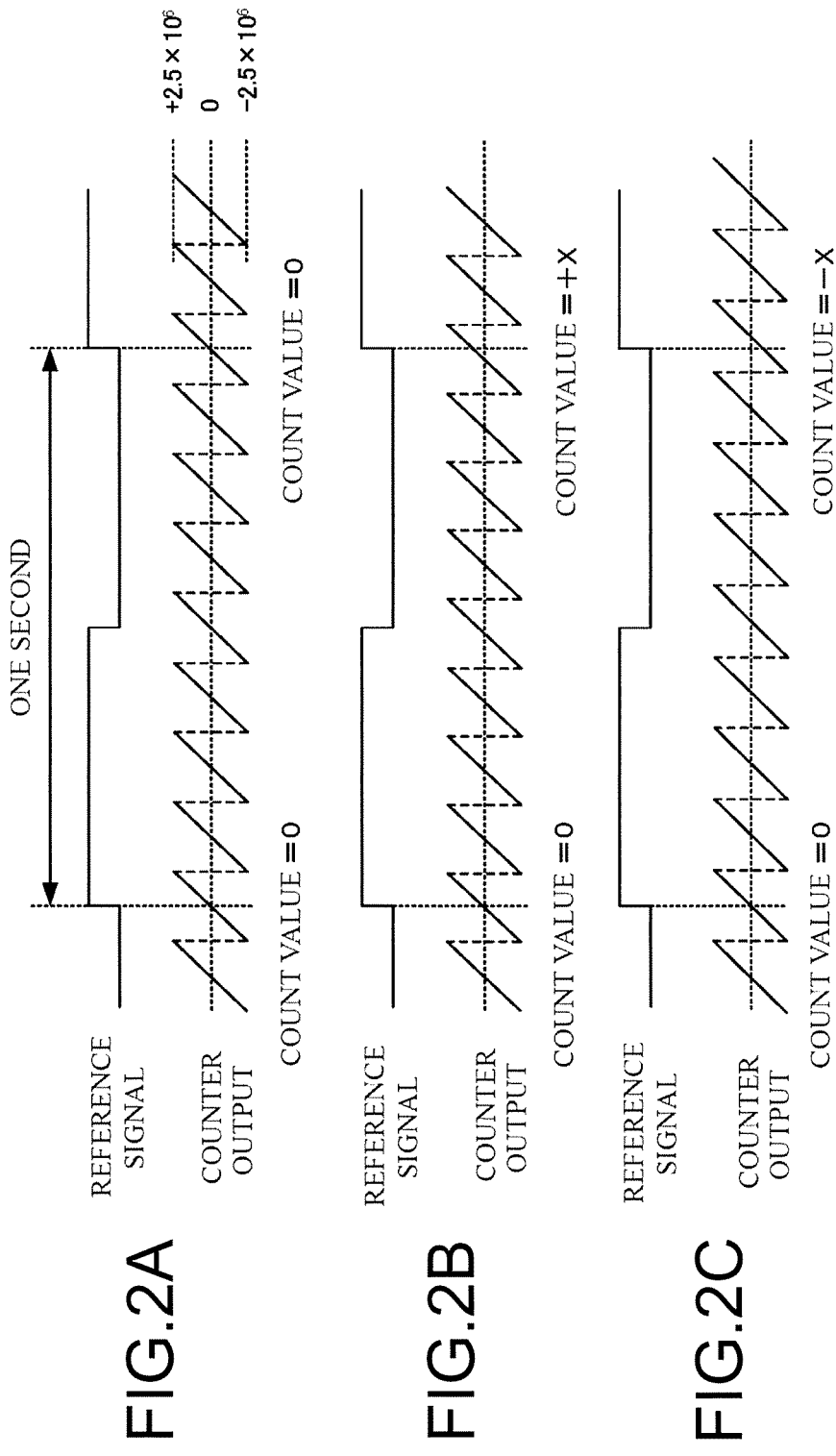
FIG. 2A to FIG. 2C are explanatory diagrams of an operation of a phase error counter.

FIG. 2A to FIG. 2C are explanatory diagrams of the operation of the phase error counter 101. FIG. 2A indicates a state without the phase difference. At a rising change point of the reference signal, the count value of the phase error counter 101 is 0. Then, the count value increases to a maximum value (for example, $+2.5 \times 10^6$) every time that the pulse of the oscillation signal is input to the phase error counter 101, subsequently the count value decreases to a minimum value (for example, $-2.5 \times 10^6$), and then the count value increases.

As illustrated in FIG. 2A, when the phase difference between the reference signal and the oscillation signal does not exist, the count value at the rising time point of the reference signal is 0, thus the phase error counter 101 outputs 0 as the count value.

On the other hand, as illustrated in FIG. 2B, when the frequency of the reference signal is higher than the frequency of the oscillation signal, the period of the counter output is short compared with the case of FIG. 2A, thus the phase error counter 101 outputs a positive value (+X) as the count value at the rising time point of the reference signal.

As illustrated in FIG. 2C, when the frequency of the reference signal is lower than the frequency of the oscillation signal, the period of the counter output is long compared with the case of FIG. 2A. Accordingly, the phase error counter 101 outputs a negative value (−X) as the count value at the rising time point of the reference signal.

Return to FIG. 1, a description will be given for the integrator 102. The integrator 102 calculates an integrated value of a difference between a reference pulse number corresponding to the frequency of the oscillation signal and a pulse number of the oscillation signal, so as to output the integrated value every time period of a predetermined times of the period of the reference signal. The reference pulse number is a number obtained by dividing the frequency (for example, 20 MHz) of the oscillation signal by the frequency (for example, 1 Hz) of the reference signal. The integrator 102 calculates the integrated value based on a value obtained by adding the count value input from the phase error counter 101 during an integration period (for example, 32 seconds) that is an integral multiple of the period of the reference signal.

The integrator 102 obtains the count value of the phase error counter 101 every one period of the reference signal, so as to accumulate the obtained count value. Then, the integrator 102 calculates a latest value of the count value accumulated during the integration period as the integrated value every time that the integration period terminates. The integrator 102 outputs the calculated integrated value to the set value generator 20 every time that the integration period terminates. The integrator 102 may initialize the integrated value to 0 every time that the integration period terminates.

The integrator 102 may calculate a moving average or a cumulative average of latest M pieces of the count value, which are input from the phase error counter 101 every one period of the reference signal, as the integrated value, so as to calculate an average value of the phase error between the reference signal and the oscillation signal.

The set value generator 20 generates a frequency setting value every predetermined time period based on the pulse number counted by the phase error counter 101. Specifically, the set value generator 20 generates the frequency setting value for controlling the frequency of the oscillation signal of the adder 30 based on the integrated value every time that the integrated value is input from the integrator 102 every time period of an integral multiple of the period of the reference signal, so as to output the generated frequency setting value to the adder 30. When the integrated value indicates a positive value, the set value generator 20 outputs the frequency setting value to decrease the frequency of the oscillation signal, and when the integrated value indicates a negative value, the set value generator 20 outputs the frequency setting value to increase the frequency of the oscillation signal.

The set value generator 20 is, for example, a Central Processing Unit (CPU) that is activated every integration period of an integral multiple of the period of the reference signal synchronized with the timing where the integrated value is input from the integrator 102, so as to vary the frequency setting value based on the integrated value. The set value generator 20 generates the frequency setting value based on, for example, a smoothed integrated value generated by smoothing a plurality of integrated values. This ensures the set value generator 20 to gradually vary the frequency of the oscillation signal.

Figure 3:
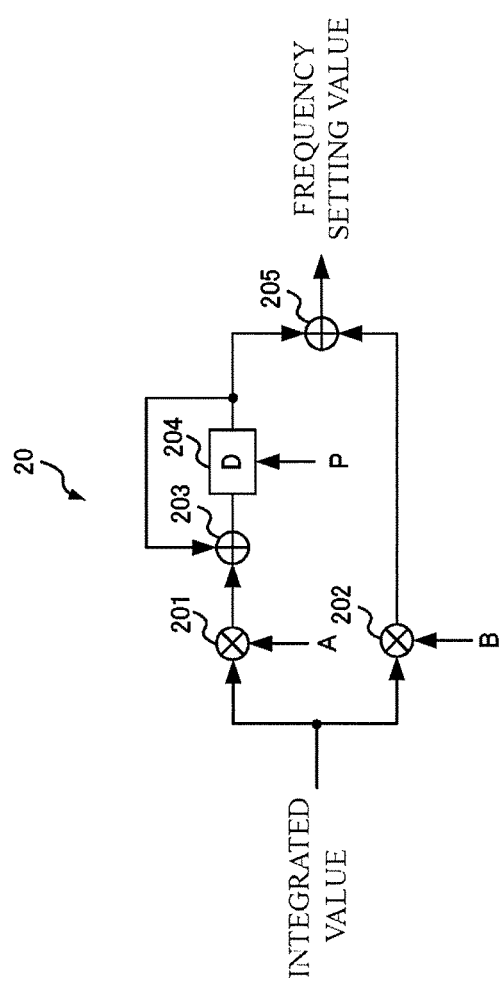
FIG. 3 is a diagram illustrating a configuration of a set value generator.

FIG. 3 is a diagram illustrating a configuration of the set value generator 20. The set value generator 20 includes a multiplier 201, a multiplier 202, an adder 203, a delay circuit 204, and an adder 205.

The integrated value input from the integrator 102 is input to the multiplier 201 and the multiplier 202. The multiplier 201 inputs a multiplication value obtained by multiplying the integrated value by a coefficient A to the adder 203.

The adder 203 outputs the multiplication value input from the multiplier 201 to the delay circuit 204. A delay period P of the delay circuit 204 is configured to be equal to the period where the integrated value is input from the phase error detector 10, such that the delay circuit 204 outputs a value after the delay to the adder 205 and outputs to the adder 203. The adder 203 adds the multiplication value input from the multiplier 201 to the value after the delay (that is, the multiplication value based on the integrated value of the period immediately before from the phase error detector 10) input from the delay circuit 204.

The multiplier 202 inputs a multiplication value obtained by multiplying the integrated value by a coefficient B to the adder 205. The adder 205 generates a frequency setting value by adding the value input from the delay circuit 204 to the value input from the multiplier 202. Such configuration ensures the set value generator 20 to output the frequency setting value obtained by smoothing the integrated value.

The set value generator 20 selects the coefficient A input to the multiplier 201 and the coefficient B input to the multiplier 202 according to whether the oscillation signal is synchronized with the reference signal at a high speed or synchronized with the reference signal at a low speed. The set value generator 20 sets the delay period P of the delay circuit 204 to be equal to the period where the integrated value is input from the phase error detector 10.

The adder 30 adds an offset value to the frequency setting value output from the set value generator 20. The offset value is a value corresponding to a target value of the frequency of the oscillation signal, and a value corresponding to the frequency of the oscillation signal output in the case where the phase error is 0. The adder 30 adds the frequency setting value input from the set value generator 20 to the offset value so as to vary the frequency of the oscillation signal around the frequency of the target frequency of the oscillation signal corresponding to the phase error between the reference signal and the oscillation signal.

The oscillator 40 outputs the oscillation signal having the frequency corresponding to the set value obtained by adding the offset value to the frequency setting value in the adder 30. The oscillator 40 may be constituted of a CPU, or may be constituted of a voltage control oscillator (Voltage Controlled Oscillator).

Modification 1

While the example where the integrator 102 initializes the integrated value every time that the integration period terminates has been described above, the integrator 102 may calculate the integrated value such that the integrator 102 accumulates the integrated value and adds a first integrated value at a time point where the integration period terminates to a second integrated value at a next integration period. This ensures, for example, the oscillation signal to be synchronized with the reference signal while the phase error accumulated during a time period is eliminated even if the reference signal is not input during the time period. The oscillator circuit 1 may include a register configured to switch the integrator 102 to a normal mode where the integrated value is initialized every time that the integration period terminates and a phase recovery mode where the integrated value is not initialized at the termination of the integration period to eliminate the accumulated phase error.

Figure 4A:
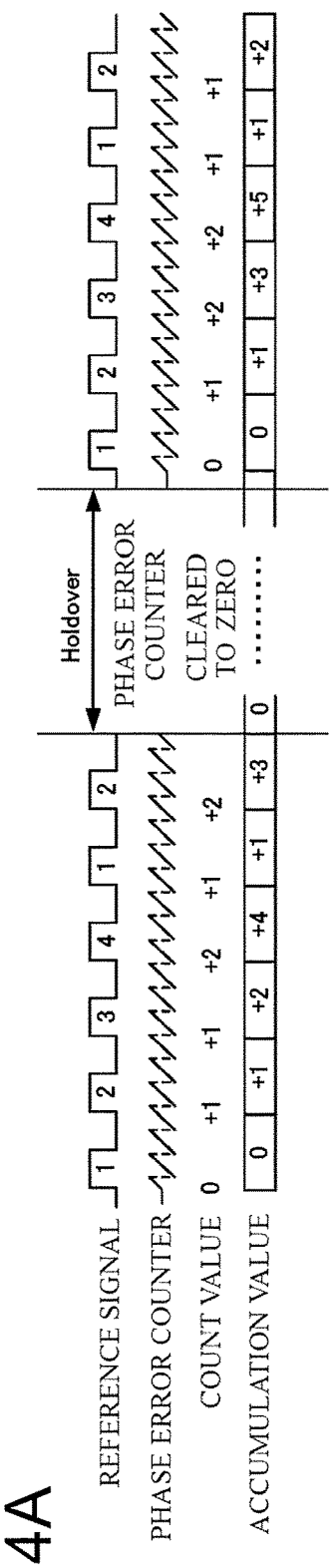
FIG. 4A and FIG. 4B are explanatory diagrams of an operation when a holdover occurs.
Figure 4B:
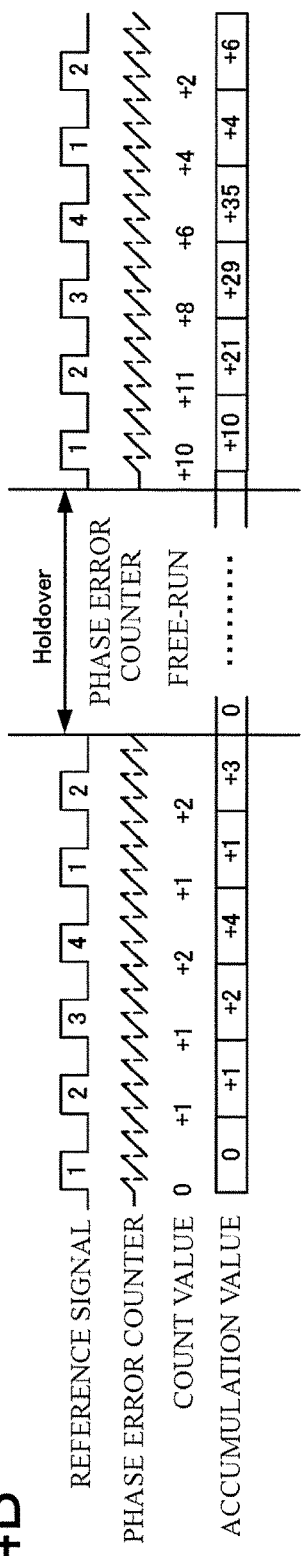

FIG. 4A and FIG. 4B are explanatory diagrams of an operation when a holdover, which is a state where the reference signal is not input, occurs. FIG. 4A and FIG. 4B illustrate the operation in the case where the count value varies to increase an accumulation value of a counter value every one period of the reference signal and the integrator 102 initializes the accumulation value every time period of four times of the period of the reference signal.

FIG. 4A illustrates the operation of the normal mode where the count value of the phase error counter 101 is cleared to zero while the holdover occurs. In this case, after the holdover terminates, the accumulation value is 0.

In contrast to this, FIG. 4B illustrates the operation of the phase recovery mode where the phase error counter 101 is operated in a free-run state while the holdover occurs. In this case, after the holdover terminates, the phase error has been accumulated and the accumulation value is +10. Thus the accumulation value where the phase error is accumulated is held, the frequency setting value is generated based on the integrated value (+35 in the case of FIG. 4B) at the termination of the integration period. As a result, the oscillator 40 can vary the frequency of the oscillation signal so as to cancel the phase error generated during the occurrence of the holdover.

Modification 2

While the example where the count value output by the phase error counter 101 varies in a range from $-2.5\times10^6$ to $+2.5\times10^6$ is indicated in FIG. 2A to FIG. 2C, the aspect of the variation of the count value output by the phase error counter 101 is not limited to this.

FIG. 5A to FIG. 5C are explanatory diagrams of an operation of a modification of the phase error counter 101. In FIG. 5A to FIG. 5C, the count value varies in a range from 0 to $5.0\times10^6$. In this case, when the frequency of the reference signal is equal to the frequency of the oscillation signal, as illustrated in FIG. 5A, the count value at the termination of the integration period is 0.

When the frequency of the reference signal is higher than the frequency of the oscillation signal, as illustrated in FIG. 5B, the count value at the termination of the integration period is equal to or less than $2.5\times10^6$. When the frequency of the reference signal is lower than the frequency of the oscillation signal, as illustrated in FIG. 5C, the count value at the termination of the integration period is larger than $2.5\times10^6$.

Modification 3

While the case where the integration period is fixed has been described above, the integrator 102 may output the integrated value every integration period determined based on a time period permitted for synchronizing the oscillation signal with the reference signal. For example, when it is necessary to synchronize at high speed, the integrator 102 reduces the integration period compared with the case of synchronizing at low speed, thus ensuring the phase error to be eliminated in a short time.

Effect of Oscillator Circuit 1 of this Embodiment

As described above, in the oscillator circuit 1, the phase error counter 101 counts the pulse number of the oscillation signal during the time period corresponding to the period of the reference signal input from outside, and the integrator 102 calculates the integrated value of the count value. Then, the set value generator 20 generates the frequency setting value every predetermined time period based on the integrated value of the pulse number counted by the phase error counter 101.

Such configuration of the oscillator circuit 1 causes the set value generator 20 only to perform the operation such that the set value generator 20 is activated at the timing of outputting the integrated value to generate the frequency setting value, and ensures the set value generator 20 to maintain a sleep state during the other time period. Accordingly, even in the case where the oscillator circuit 1 is used under a comparatively high temperature (for example, approximately 85° C.) as an Oven Controlled Crystal Oscillator (OCXO) and the set value generator 20 is constituted of a CPU, the operating period of the set value generator 20 can be shortened compared with a conventional technique, thus reducing the deterioration of the components (for example, CPU) constituting the set value generator 20 so as to extend the product lifetime of the components.

This disclosure is described with the embodiments. The technical scope of this disclosure is not limited to the above-described embodiments. Various modifications and improvements of the embodiments will become apparent to those skilled in the art. It is apparent that embodiments thus modified and improved are also within the technical scope of this disclosure according to the description of the claims.

For example, the set value generator 20 may calculate the frequency setting value based on the count value at every timing where the phase error counter 101 outputs the count value instead of based on the integrated value input from the integrator 102.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. An oscillator circuit comprising:
    an oscillating unit configured to output an oscillation signal having a frequency corresponding to a frequency setting value being input;
    a counter unit configured to count a number of pulses of the oscillation signal during a time period corresponding to a period of a reference signal input from outside;
    a set value generator configured to generate the frequency setting value every predetermined time period based on the count of the pulses counted by the counter unit; and
    an integration unit configured to calculate an integrated value of a difference between a reference pulse number corresponding to the frequency of the oscillation signal and a pulse number of the oscillation signal every period of the reference signal, and output the integrated value every time period of predetermined times of the period of the reference signal, wherein
    the set value generator controls the frequency setting value based on the integrated value.

2. The oscillator circuit according to claim 1, wherein the set value generator is activated every integration period of an integral multiple of the period of the reference signal to vary the frequency setting value based on the integrated value.

3. The oscillator circuit according to claim 2, wherein the integration unit initializes the integrated value every time that the integration period terminates.

4. The oscillator circuit according to claim 2, wherein the integration unit adds a first integrated value at the termination of the integration period to a second integrated value at a next integration period so as to calculate the integrated value.

5. The oscillator circuit according to claim 2, wherein the integration unit outputs the integrated value every integration period determined based on a time period permitted for synchronizing the oscillation signal with the reference signal.

6. The oscillator circuit according to claim 1, wherein the set value generator generates the frequency setting value based on a smoothed integrated value generated by smoothing a plurality of the integrated values.

* * * * *